(12) United States Patent
Chetlur et al.

(10) Patent No.: US 11,367,830 B2
(45) Date of Patent: Jun. 21, 2022

(54) MULTI-LAYER INTEGRATED CIRCUIT WITH ENHANCED THERMAL DISSIPATION USING BACK-END METAL LAYERS

(71) Applicant: Allegro MicroSystems, LLC, Manchester, NH (US)

(72) Inventors: Sundar Chetlur, Frisco, TX (US); Maxim Klebanov, Palm Coast, FL (US); Paolo Campiglio, Arcueil (FR); Yen Ting Liu, Hsinchu (TW)

(73) Assignee: Allegro MicroSystems, LLC, Manchester, NH (US)

( * ) Notice: Subject to any disclaimer, the term of this patent is extended or adjusted under 35 U.S.C. 154(b) by 104 days.

(21) Appl. No.: 17/014,129

(22) Filed: Sep. 8, 2020

(65) Prior Publication Data

US 2022/0077382 A1    Mar. 10, 2022

(51) Int. Cl.
| | |
|---|---|
| *H01L 43/02* | (2006.01) |
| *G01R 33/09* | (2006.01) |
| *H01L 27/22* | (2006.01) |
| *H01L 43/08* | (2006.01) |
| *H01L 43/12* | (2006.01) |

(52) U.S. Cl.
CPC ............ *H01L 43/02* (2013.01); *G01R 33/093* (2013.01); *G01R 33/098* (2013.01); *H01L 27/22* (2013.01); *H01L 43/08* (2013.01); *H01L 43/12* (2013.01)

(58) Field of Classification Search
CPC ......... H01L 43/02; H01L 27/22; H01L 43/08; H01L 43/12; G01R 33/093; G01R 33/098
USPC ........................................................ 257/421
See application file for complete search history.

(56) References Cited

U.S. PATENT DOCUMENTS

| 10,186,308 B1 | 1/2019 | Guarisco et al. |
| 10,734,443 B2 | 8/2020 | Lassalle-Balier et al. |
| 10,753,989 B2 * | 8/2020 | Campiglio .............. H01L 43/08 |

(Continued)

FOREIGN PATENT DOCUMENTS

| CN | 105938821 A | 9/2016 |
| CN | 110678995 A | 1/2020 |
| TW | 201606895 A | 2/2016 |

OTHER PUBLICATIONS

PCT International Search Report and Written Opinion dated Sep. 27, 2021 for International Application No. PCT/US2021/037360; 15 Pages.

(Continued)

*Primary Examiner* — Jami Valentine Miller
(74) *Attorney, Agent, or Firm* — Daly Crowley Mofford & Durkee, LLP

(57) ABSTRACT

In one aspect, an integrated circuit includes a first conductive layer and a magnetoresistance element (MRE) disposed over and coupled to the first layer through first vias. The MRE is magnetized to produce a first magnetic orientation. The first layer is disposed over and coupled to a second conductive layer in the circuit through second vias. The circuit also includes a metal filler disposed proximate to the MRE. The metal filler is positioned over and coupled to the second layer through third vias. The circuit also includes a thermal dissipation path resulting from a physical input applied to the first MRE. The thermal dissipation path extends through the first through third vias, the first and second layers, an integrated circuit interconnection, and the metal filler.

45 Claims, 9 Drawing Sheets

(56) References Cited

U.S. PATENT DOCUMENTS

| | | | |
|---|---|---|---|
| 2003/0207112 A1* | 11/2003 | Yadav | C04B 35/2666 |
| | | | 106/400 |
| 2004/0252414 A1 | 12/2004 | Mao et al. | |
| 2005/0216075 A1* | 9/2005 | Wang | A61L 31/18 |
| | | | 623/1.46 |
| 2006/0290348 A1 | 12/2006 | Sato | |
| 2009/0184281 A1* | 7/2009 | Yadav | C04B 2/10 |
| | | | 252/502 |
| 2012/0040531 A1* | 2/2012 | Mao | H01L 21/31116 |
| | | | 438/687 |
| 2019/0198755 A1* | 6/2019 | Ito | H01L 21/8239 |
| 2019/0247050 A1* | 8/2019 | Goldsmith | A61F 2/82 |
| 2019/0249289 A1* | 8/2019 | Sakio | C23C 14/541 |
| 2022/0077382 A1* | 3/2022 | Chetlur | H01L 43/02 |

OTHER PUBLICATIONS

U.S. Appl. No. 17/653,484, filed Mar. 4, 2022, Chetlur et al.
Taiwan Office Action (with Machine English Translation) dated Apr. 20, 2022 for Taiwan Application No. 110123964; 20 Pages.

* cited by examiner

400A

---

PROVIDE A FIRST CONDUCTIVE LAYER FOR A MULTI-LAYER INTEGRATED CIRCUIT
402

↓

DISPOSE A FIRST MAGNETORESISTANCE ELEMENT OVER A FIRST PORTION OF THE FIRST CONDUCTIVE LAYER & COUPLE THE FIRST MAGNETORESISTANCE ELEMENT TO THE FIRST PORTION OF THE FIRST CONDUCTIVER LAYER THROUGH FIRST VIAS
404

↓

DISPOSE THE FIRST CONDUCTIVE LAYER OVER A SECOND CONDUCTIVE LAYER IN THE MULTI-LAYER INTEGRATED CIRCUIT & COUPLE THE FIRST PORTION OF THE FIRST CONDUCTIVE LAYER TO A FIRST PORTION OF THE SECOND CONDUCTIVER LAYER THROUGH SECOND VIAS, THE FIRST PORTION OF THE SECOND CONDUCTIVE LAYER INCLUDING A FIRST INTEGRATED CIRCUIT INTERCONNECTION CONNECTING THE FIRST MAGNETORESISTANCE ELEMENT TO CIRCUITRY AND A SILICONE BASE SUBSTRATE OF THE MULTI-LAYER INTEGRATED CIRCUIT
406

↓

DISPOSE A FIRST METAL FILLER PROXIMATE TO THE FIRST PORTION OF THE FIRST CONDUCTIVE LAYER AND THE FIRST MAGNETORESISTANCE ELEMENT
408

↓

COUPLE THE FIRST METAL FILLER TO A SECOND PORTION OF THE SECOND CONDUCTIVE LAYER THROUGH THIRD VIAS
410

↓

MAGNETIZE THE FIRST MAGNETORESISTANCE ELEMENT TO PRODUCE A FIRST MAGNETIC ORIENTATION: HEAT RESULTING FROM AN INPUT TO THE FIRST MAGNETORESISTANCE ELEMENT IS EVACUATED TOWARD THE SILICONE BASE SUBSTRATE THROUGH THE FIRST VIAS, THE FIRST INTEGRATED CIRCUIT INTERCONNECTION OF THE FIRST PORTION OF THE SECOND CONDUCTIVE LAYER, THE FIRST METAL FILLER, THE THIRD VIAS, AND THE SECOND PORTION OF THE SECOND CONDUCTIVE LAYER
412

```
┌─────────────────────────────────────────────────────────────────┐
│ DISPOSE A SECOND MAGNETORESISTANCE ELEMENT OVER A SECOND        │
│ PORTION OF THE FIRST CONDUCTIVE LAYER & COUPLE THE SECOND       │
│ MAGNETORESISTANCE ELEMENT TO THE SECOND PORTION OF THE FIRST    │
│ CONDUCTIVE LAYER THROUGH FOURTH VIAS                            │
│                              414                                │
└─────────────────────────────────────────────────────────────────┘
                                  ↓
┌─────────────────────────────────────────────────────────────────┐
│ DISPOSE A FIRST METAL JUMPER INTERCONNECT OVER THE FIRST        │
│ MAGNETORESISTANCE ELEMENT AND THE SECOND MAGNETORESISTANCE      │
│ ELEMENT                                                         │
│                              416                                │
└─────────────────────────────────────────────────────────────────┘
                                  ↓
┌─────────────────────────────────────────────────────────────────┐
│ COUPLE THE FIRST METAL JUMPER INTERCONNECT TO THE FIRST         │
│ MAGNETORESISTANCE ELEMENT THROUGH FIFTH VIAS AND TO THE SECOND  │
│ MAGNETORESISTANCE ELEMENT THROUGH SIXTH VIAS                    │
│                              418                                │
└─────────────────────────────────────────────────────────────────┘
                                  ↓
┌─────────────────────────────────────────────────────────────────┐
│ MAGNETIZE THE SECOND MAGNETORESISTANCE ELEMENT SIMULTANEOUSLY   │
│ WITH THE FIRST MAGNETORESISTANCE ELEMENT: HEAT RESULTING FROM   │
│ THE INPUT TO THE FIRST MAGNETORESISTANCE ELEMENT IS FURTHER     │
│ EVACUATED TOWARD THE SILICONE BASE SUBSTRATE THROUGH THE FIFTH  │
│ VIAS, THE FIRST METAL JUMPER INTERCONNECT, THE SIXTH VIAS, THE  │
│ SECOND MAGNETORESISTANCE ELEMENT, THE FOURTH VIAS, AND THE      │
│ SECOND PORTION OF THE FIRST CONDUCTIVE LAYER                    │
│                              420                                │
└─────────────────────────────────────────────────────────────────┘
```

```
DISPOSE A THIRD MAGNETORESISTANCE ELEMENT OVER THE SECOND
PORTION OF THE FIRST CONDUCTIVE LAYER & COUPLE THE THIRD
MAGNETORESISTANCE ELEMENT TO THE SECOND PORTION OF THE FIRST
CONDUCTIVE LAYER THROUGH SEVENTH VIAS
422
```

```
DISPOSE A SECOND METAL FILLER PROXIMATE TO THE SECOND PORTION
OF THE FIRST CONDUCTIVE LAYER AND THE THIRD MAGNETORESISTANCE
ELEMENT
424
```

```
COUPLE THE SECOND METAL FILLER TO THE SECOND PORTION OF THE
SECOND CONDUCTIVE LAYER THROUGH EIGHTH VIAS
426
```

```
MAGNETIZE THE THIRD MAGNETORESISTANCE ELEMENT TO PRODUCE A
SECOND MAGNETIC ORIENTATION THAT IS DIFFERENT FROM THE FIRST
MAGNETIC ORIENTATION: HEAT RESULTING FROM INPUT APPLIED TO THE
THIRD MAGNETORESISTANCE ELEMENT IS EVACUATED TOWARD THE
SILICON BASE SUBSTRATE THROUGH SEVENTH VIAS, THE SECOND PORTION
OF THE FIRST CONDUCTIVE LAYER, THE SECOND METAL FILLER, THE EIGHTH
VIAS, AND THE SECOND PORTION OF THE SECOND CONDUCTIVE LAYER
428
```

```
┌─────────────────────────────────────────────────────────────────┐
│   DISPOSE A FOURTH MAGNETORESISTANCE ELEMENT OVER A THIRD       │
│   PORTION OF THE FIRST CONDUCTIVE LAYER & COUPLE THE FOURTH     │
│   MAGNETORESISTANCE ELEMENT TO THE THIRD PORTION OF THE FIRST   │
│          CONDUCTIVE LAYER THROUGH NINTH VIAS                    │
│                            430                                  │
└─────────────────────────────────────────────────────────────────┘
                               │
                               ▼
┌─────────────────────────────────────────────────────────────────┐
│   DISPOSE THE THIRD PORTION OF THE FIRST CONDUCTIVE LAYER OVER  │
│  A THIRD PORTION OF THE SECOND CONDUCTIVE LAYER & COUPLE THE    │
│  THIRD PORTION OF THE FIRST CONDUCTIVE LAYER TO THE THIRD       │
│  PORTION OF THE SECOND CONDUCTIVE LAYER THROUGH TENTH VIAS      │
│                            432                                  │
└─────────────────────────────────────────────────────────────────┘
                               │
                               ▼
┌─────────────────────────────────────────────────────────────────┐
│ DISPOSE A SECOND METAL JUMPER INTERCONNECT OVER THE THIRD AND   │
│ FOURTH MAGNETORESISTANCE ELEMENTS & COUPLE THE SECOND METAL     │
│  JUMPER INTERCONNECT TO THE THIRD MAGNETORESISTANCE ELEMENT     │
│    THROUGH ELEVENTH VIAS AND TO THE FOURTH MAGNETORESISTANCE    │
│  ELEMENT THROUGH TWELFTH VIAS: HEAT RESULTING FROM INPUT APPLIED│
│  TO THE FOURTH MAGNETORESISTANCE ELEMENT IS EVACUATED TOWARD    │
│  THE SILICON BASE STRUCTURE THROUGH NINTH VIAS, THE THIRD PORTION│
│    OF THE FIRST CONDUCTIVE LAYER, THE TENTH VIAS, THE SECOND    │
│  INTEGRATED CIRCUIT INTERCONNECTION OF THE THIRD PORTION OF THE │
│   SECOND CONDUCTIVE LAYER, THE TWELFTH VIAS, THE SECOND METAL   │
│    JUMPER INTERCONNECT, THE ELEVENTH VIAS, THE THIRD MAGNETO-   │
│  RESISTANCE ELEMENT, THE SEVENTH VIAS, THE SECOND PORTION OF THE│
│   FIRST CONDUCTIVE LAYER, THE SECOND METAL FILLER, THE EIGHTH VIAS,│
│    AND THE SECOND PORTION OF THE SECOND CONDUCTIVE LAYER        │
│                            434                                  │
└─────────────────────────────────────────────────────────────────┘
```

MULTI-LAYER INTEGRATED CIRCUIT WITH ENHANCED THERMAL DISSIPATION USING BACK-END METAL LAYERS

BACKGROUND

Magnetic field sensors are used in a variety of applications including, but not limited to, an angle sensor that senses an angle of a direction of a magnetic field, a current sensor that senses a magnetic field generated by a current carried by a current-carrying conductor, a magnetic switch that senses the proximity of a ferromagnetic object, and a magnetic field sensor that senses a magnetic field density of a magnetic field.

Some magnetic field sensors include magnetoresistance (MR) elements, such as giant magnetoresistance (GMR) elements and tunneling magnetoresistance (TMR). Generally, GMR and TMR elements have a relatively high sensitivity compared to other types of sensing elements, such as Hall effect elements. GMR and TMR elements have moderately good linearity, but over a restricted range of magnetic fields. However, even in the restricted range of magnetic fields, the linearity of the GMR or TMR element can suffer from irregularities, such as due to high temperatures during MR element processing (e.g., during fabrication).

A reference layer of a magnetoresistive array may be oriented by heating up the underlying wafer in the presence of a magnetic field in which elements in the array are oriented in the same fashion. In some applications, however, there is a need to have different reference orientations on the same die. This can be obtained by heating the magnetoresistive elements locally, with a current or laser pulses. However, thermal heat resulting from this process can degrade the magnetoresistive elements and their interconnections.

SUMMARY

In one aspect, a multi-layer integrated circuit having enhanced thermal dissipation is provided. The multi-layer integrated circuit includes a first conductive layer and a first magnetoresistance element disposed over and coupled to a first portion of the first conductive layer through first vias. The first magnetoresistance element is magnetized to produce a first magnetic orientation. The first conductive layer is disposed over a second conductive layer in the multi-layer integrated circuit, and the first portion of the first conductive layer is coupled to a first portion of the second conductive layer through second vias. The circuit also includes a first metal filler disposed proximate to the first portion of the first conductive layer and the first magnetoresistance element. The first metal filler is positioned over and coupled to a second portion of the second conductive layer through third vias. The circuit also includes a first thermal dissipation path resulting from a physical input applied to the first magnetoresistance element. The first thermal dissipation path extends through the first vias, the first portion of the first conductive layer, the second vias, a first integrated circuit interconnection, the first metal filler, the third vias, and the second portion of the second conductive layer.

In a further aspect, a method of manufacturing a multi-layer integrated circuit having enhanced thermal dissipation is provided. The method includes providing a first conductive layer, disposing a first magnetoresistance element over a first portion of the first conductive layer and coupling the first magnetoresistance element to the first portion of the first conductive layer through first vias. The method also includes disposing the first conductive layer over a second conductive layer in the multi-layer integrated circuit and coupling the first portion of the first conductive layer to a first portion of the second conductive layer through second vias. The method further includes disposing a first metal filler proximate to the first portion of the first conductive layer and the first magnetoresistance element in the first conductive layer. The method also includes coupling the first metal filler to a second portion of the second conductive layer through third vias. The method also includes magnetizing the first magnetoresistance element to produce a first magnetic orientation. Heat resulting from a physical input applied to the first magnetoresistance element is evacuated away from the first magnetoresistance element through the first vias, the first portion of the first conductive layer, the second vias, a first integrated circuit interconnection, the first metal filler, the third vias, and the second portion of the second conductive layer.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

FIGS. 4A-4D describe processes for manufacturing a multi-layer integrated circuit including a magnetoresistive array with enhanced thermal dissipation in accordance with an embodiment;

DETAIL DESCRIPTION

Described herein are techniques to improve thermal dissipation properties of an integrated circuit that includes a magnetoresistive array. Currently, providing a balance between proper magnetization of magnetoresistance elements and effective heat dissipation is challenging. Too much heat applied to the circuit and the magnetoresistance elements and surrounding areas can become damaged. On the other hand, too little energy or power applied to the circuit can result in reduced and insufficient magnetization of the magnetoresistance elements. Typical integrated circuits having sensor devices that require magnetization rely on the underlying layers of the circuits to offer some heat dissipation. However, not all components of the circuits provide effective means of transfer of heat. For example, certain circuit layers/components may be formed of non-conductive materials (e.g., silicon dioxide) and the corresponding density of vias that connect the layers together is often too small to effectively transfer heat away from the heat source.

In the embodiments described herein, the thermal dissipation properties of an integrated circuit having sensor elements (e.g., a magnetoresistance array) employ the use of circuit layers to diffuse heat resulting from magnetization processes.

Figure 1:
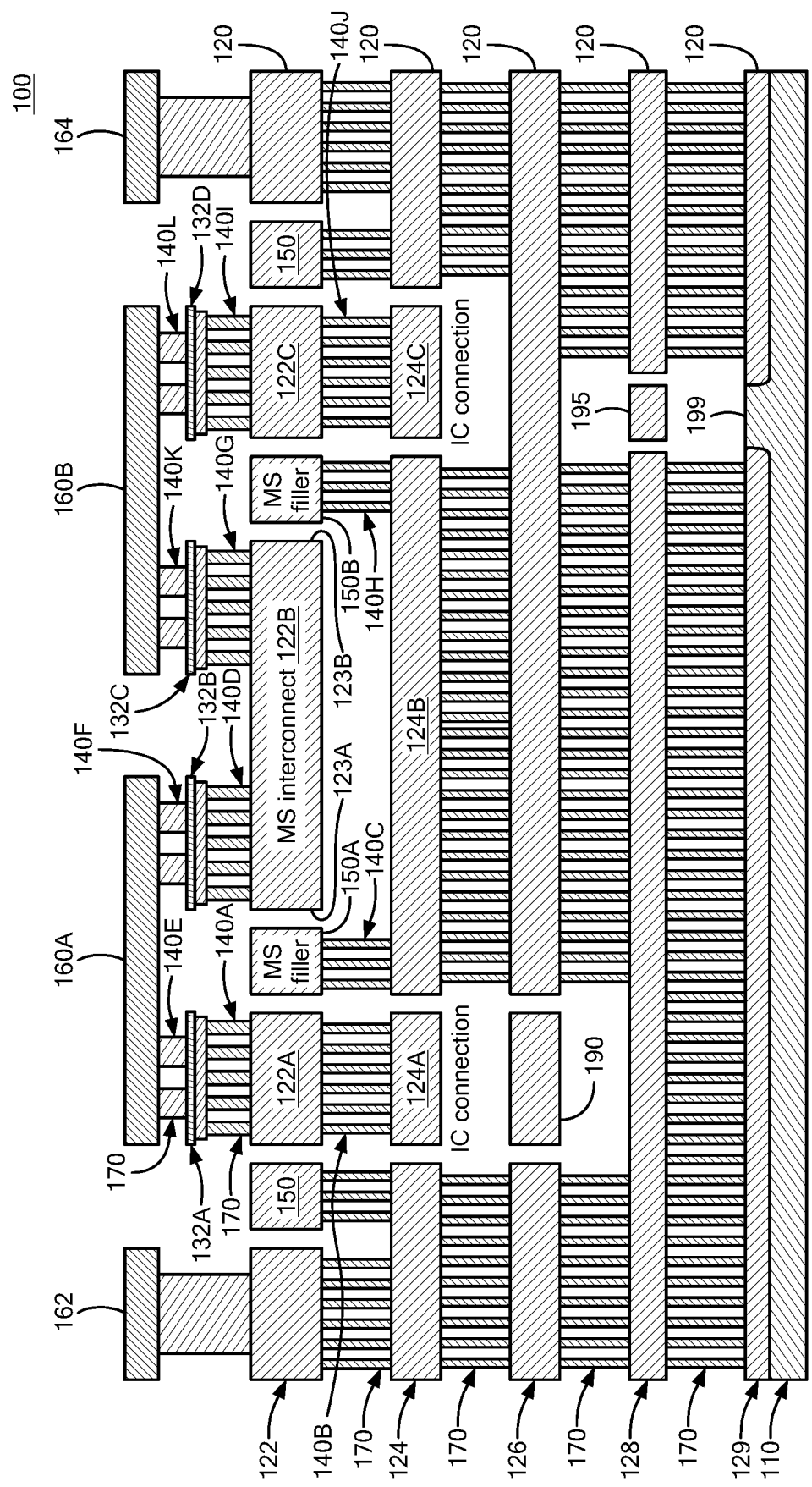
FIG. 1 is a cross-sectional view of a multi-layer integrated circuit including a magnetoresistive array having enhanced thermal dissipation in accordance with an embodiment.

Referring to FIG. 1, an embodiment of an integrated circuit 100 generally includes a base substrate 110, multiple conductive layers 122, 124, 126, 128, and 129 (collectively referred to herein as "120"), a magnetoresistive array comprised of magnetoresistance elements 132A-132D, metal fillers 150A and 150B (collectively referred to as "150"), and various interconnects and circuitry (not shown), as will be described further herein.

In embodiments, the base substrate 110 may be comprised of silicon. Layers of the integrated circuit are coupled by vias (collectively shown as 170) that include the interconnects that connect the magnetoresistance array elements to the underlying circuitry (not shown) of the integrated circuit 100 (e.g., where the circuitry resides in the base substrate 110). In embodiments, the lower metal layer 129 (e.g., polysilicon layer) is directly above the base substrate 110. The polysilicon layer 129 may be connected to the substrate 110 through inter-layer dielectrics (ILDs) that form an insulating layer between interconnects in the circuit.

In embodiments, the level of thermal dissipation achieved during a magnetization process of the magnetoresistance array is a function of at least the number of conductive layers 120 contained in the multi-layer integrated circuit, the number and physical placement of metal fillers (e.g., 150A, 150B), the number and physical placement of interconnect layers 170, via density in the interconnect layers, as well as other factors, as will now be described.

As shown in the embodiment depicted in FIG. 1, the multi-layer integrated circuit 100 includes a first conductive layer 122 and a first magnetoresistance element 132A disposed over and coupled to a first portion 122A of the first conductive layer 122 through first vias 140A. In an embodiment, the magnetoresistance element 132A comprises a tunneling magnetoresistance (TMR) element.

The first conductive layer 122 is disposed over a second conductive layer 124 in the multi-layer integrated circuit 100, and the first portion 122A of the first conductive layer 122 is coupled to a first portion 124A of the second conductive layer 124 through second vias 140B. In an embodiment, the first portion 124A of the second conductive layer 124 includes a first integrated circuit interconnection that electronically connects the first magnetoresistance element 132A to the circuitry below via the layers 122 and 126-129 and, in turn, to the silicon base substrate 110 of the multi-layer integrated circuit 100. The circuitry may contain various electronic components, such as processors, logic, memory, switches, encoders/decoders, amplifiers, etc.).

In embodiments, a first metal filler 150A of the first conductive layer 122 is disposed proximate to the first portion 122A of the first conductive layer 122 and the first magnetoresistance element 132A in the first conductive layer 122. The first metal filler may comprise any type of suitable thermally conductive material (e.g., a metal or composition of different metals). In an embodiment, the metal filler may be disposed on the second conductive layer in a location that is proximate to the magnetoresistance element and in any available space on the second conductive layer that is not already taken by other components of the circuit 100. Close proximity of the metal filler to the magnetoresistance element enables additional heat sink properties.

As shown in FIG. 1, the first metal filler 150A is positioned over and coupled to a second portion 124B of the second conductive layer 124 through third vias 140C.

As indicated above, magnetoresistance elements are magnetized in which a physical input is applied to the elements in order to magnetically orient the elements in various directions. In an embodiment, the physical input may be one of electrical current or laser pulses.

Thus, when first magnetoresistance element 132A is magnetized to produce a first magnetic orientation, heat resulting from a physical input applied to the first magnetoresistance element 132A is evacuated away from the first magnetoresistance element through the first vias 140A, the first portion 122A of the first conductive layer 122, the second vias 140B, the first integrated circuit interconnection of the first portion 124A of the second conductive layer 124, the first metal filler 150A, the third vias 140C, the second portion 124B of the second conductive layer 124, as well as the alternating conductive layers 120 and via-containing interconnection layers 170 down to the substrate 110.

Also shown in FIG. 1, the multi-layer integrated circuit also includes a second magnetoresistance element 132B disposed over and coupled to a second portion 122B of the first conductive layer 122 through fourth vias 140D. The second magnetoresistance element may be a tunneling magnetoresistance (TMR) element.

Also shown in FIG. 1 is a first metal jumper interconnect 160A disposed over the first magnetoresistance element 132A and the second magnetoresistance element 132B. The first metal jumper interconnect 160A is coupled to the first magnetoresistance element 132A through fifth vias 140E and to the second magnetoresistance element 132B through sixth vias 140F. In an embodiment, second magnetoresistance element 132B is magnetized simultaneously with the first magnetoresistance element 132A to produce the first magnetic orientation. Thus, the first and second magnetoresistance elements are simultaneously magnetized and oriented in a single direction. However, it will be understood that these magnetoresistance elements may be configured to be individually magnetized and oriented in different directions in order to realize the advantages of the embodiments described herein.

In an embodiment, heat resulting from the input applied to the first magnetoresistance element 132A is further dissipated away from the element 132A, e.g., toward the metal jumper interconnect 160A as well as toward the silicon base substrate 110 through alternating conductive layers 120 and via-containing interconnection layers 170. As shown in FIG. 1, the heat may dissipate away from the first magnetoresistance element 132A through the fifth vias 140E, the first metal jumper interconnect 160A, the sixth vias 140F, the second magnetoresistance element 132B, the fourth vias 140D, and the second portion 122B of the first conductive layer 122.

Also shown in FIG. 1, is a third magnetoresistance element 132C disposed over and coupled to the second portion 122B of the first conductive layer 122 through seventh vias 140G. Similar to the first and second magnetoresistance elements, the third magnetoresistance element 132C may be a tunneling magnetoresistance (TMR) element.

In embodiments, a second metal filler 150B is disposed proximate to the second portion 122B of the first conductive layer 122 and the third magnetoresistance element 132C. The second metal filler comprises a thermal conductive element. The second metal filler 150B is disposed over and coupled to the second portion 124B of the second conductive layer 124 through eighth vias 140H.

As shown in FIG. 1, the second portion 122B of the first conductive layer 122 includes opposing first and second edges (edges 123A and 123B, respectively). The first metal filler 150A is disposed adjacent to the first edge 123A of the second portion 122B of the first conductive layer 122, and the second metal filler 150B is disposed adjacent to the second edge 123B of the second portion 122B of the first conductive layer 122. Thus, the close proximity of the first and second metal fillers 150A and 150B provide additional thermal dissipation capabilities with respect to heat evacuation from the magnetoresistance elements.

For example, in the embodiment shown in FIG. 1, heat resulting from a physical input applied to the third magnetoresistance element 132C is evacuated away from the third magnetoresistance element 132C in varying directions (e.g., toward the silicon base substrate 110 of the multi-layer integrated circuit 100 through the seventh vias 140G, the second portion 122B of the first conductive layer 122, the second metal filler 150B, the eighth vias 140H, the second portion 124B of the second conductive layer 124 down through the lower alternating conductive layers 120 and via-containing interconnection layers 170).

Also shown in FIG. 1 is a fourth magnetoresistance element 132D disposed over and coupled to a third portion 122C of the first conductive layer 122 through ninth vias 140I. The fourth magnetoresistance element may be a tunneling magnetoresistance (TMR) element.

As illustrated, the third portion 122C of the first conductive layer 122 is disposed over and coupled to a third portion 124C of the second conductive layer 124 through tenth vias 140I. The third portion 124C of the second conductive layer 124 includes a second integrated circuit interconnection that connects the fourth magnetoresistance element 132D to the circuitry and the silicon base substrate 110 of the multi-layer integrated circuit 100.

A second metal jumper interconnect 160B is disposed over the third and fourth magnetoresistance elements 132C and 132D, respectively, and the second metal jumper interconnect 160B is coupled to the third magnetoresistance element 132C through eleventh vias 140K and to the fourth magnetoresistance element 132D through twelfth vias 140L.

The second metal filler 150B is disposed between the third magnetoresistance element 132C and the fourth magnetoresistance element 132D in the first conductive layer 122 to provide effective aid in thermal dissipation.

For example, heat resulting from a physical input applied to the fourth magnetoresistance element 132D is evacuated away from the fourth magnetoresistance element 132D (e.g., toward the silicon base structure 110 of the multi-layer integrated circuit through the ninth vias 140I, the third portion 122C of the first conductive layer 122, the tenth vias 140I, the second integrated circuit interconnection of the third portion 124C of the second conductive layer 124, the twelfth vias 140L, the second metal jumper interconnect 160B, the eleventh vias 140K, the third magnetoresistance element 132C, the seventh vias 140G, the second portion 122B of the first conductive layer 122, the second metal filler 150B, the eighth vias 140H, and the second portion 124B of the second conductive layer 124).

Also shown in FIG. 1 are metal structures 162 and 164 coupled to portions of layer 122. The metal used for the jumper (e.g., 160A) may be the first one exposed to the heat source and thus may reach a higher temperature than adjacent components in the circuit. However, the metal jumpers 160A/160B may be used as electrical jumpers and thus may not be grounded, which could result in a short circuit. The two structures 162 and 164 connect the top metal to the substrate to evacuate the heat but without being connected to the magnetoresistance elements (e.g., they can use dummy magnetoresistance or regular via arrays, as shown in FIG. 1).

The first conductive layer 122 also includes an interconnect structure interconnecting the second magnetoresistance element 132B and the third magnetoresistance element 132C. As shown in FIG. 1, for example, the second portion 122B of the first conductive layer 122 represents the interconnect structure interconnecting the second magnetoresistance element 132B and the third magnetoresistance element 132C. This interconnect structure further enables heat dissipation among the circuit elements as described above.

While the embodiment in FIG. 1 is described as providing two metal fillers and four magnetoresistance elements, it will be understood that multiple fillers and magnetoresistance elements may be included in the circuit 100. For example, two additional metal fillers (shown generally at 150) may also provide diffusion capabilities with respect to heat surrounding the circuit elements. The fillers and components are shown for illustrative purposes and for ease of description only.

The vias 170 (including vias 140A-140L) may be formed in inter-metal dielectric (IMD) layers (e.g., a material placed between metal layers to isolate them). Non-limiting examples of the material include silicon oxide or silicon nitride.

As indicated above, the magnetoresistance elements may be tunneling magnetoresistance elements (TMRs). A TMR element may contain a stack of layers (not shown) indicative of, e.g., a pillar of a multi-pillar element. Non-limiting examples of the layers may include, e.g., a seed layer (e.g., copper nickel (CuN), and a combination of: platinum manganese (PtMn) or iridium manganese (IrMn), cobalt iron (CoFe), a magnesium oxide (MgO), and a tantalum (Ta), to name a few. A cap layer may comprise, e.g., tantalum (Ta). It will be understood that a driving current running through the TMR element runs through the layers of the stack/pillar, running between seed and cap layers, i.e., perpendicular to a surface of a bottom electrode.

As shown in FIG. 1, two non-connected elements 190 and 195 are provided to show that adding this heat-dissipation structure is compatible with other metal lines below the magnetoresistance elements. These metal lines are configured to route the electronic circuits on the die and thus may be widely used. Avoiding this when the heat-dissipation structures are present will be very limiting for the electronic design. Thus, a space, or hole, in the structures may be provided to leave the necessary space for these lines to pass. However, they are not electrically connected to avoid a short circuit (e.g., as non-connected element 199 is lined up with line 195.

Figure 2:
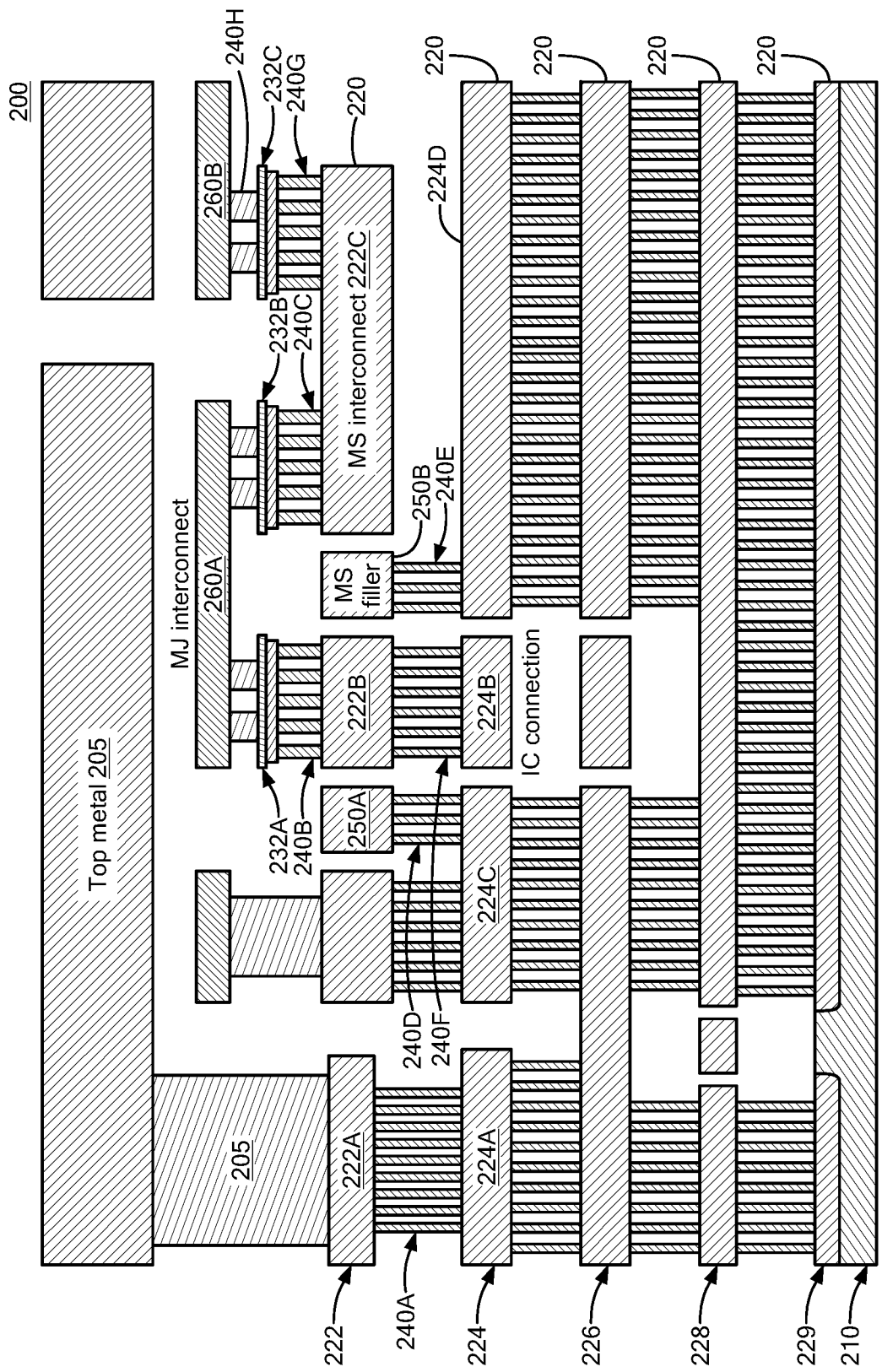
FIG. 2 is a cross-sectional view of a multi-layer integrated circuit including a magnetoresistive array having enhanced thermal dissipation in accordance with another embodiment.

Turning now to FIG. 2, a portion of a multi-layer integrated circuit 200 with enhanced thermal dissipation according to another embodiment will now be described. The circuit 200 may contain similar elements to those described above with respect to the circuit 100 of FIG. 1 and will not be further discussed.

The circuit 200 includes a base substrate 210, multiple conductive layers 220 (layers 222, 224, 226, 228, and 229), a magnetoresistive array comprised of magnetoresistance elements 232A-232C, metal fillers 250A and 250B (collectively "250"), and various interconnects (e.g., integrated circuit interconnection 224B) and circuitry (not shown). In embodiments, the level of thermal dissipation achieved is a function of at least the number of conductive layers contained in the multi-layer integrated circuit, the number and physical placement of metal fillers, and the number and physical placement of the interconnects.

In addition, the circuit 200 includes a top thermal conductive element 205 extending over and across the circuit 200. The thermal conductive element 205 may comprise any suitable conductive material, such as a metal. In an embodiment, the element 205 is connected all the way down to the substrate 110.

It is understood that the width, or dimensions, of the thermal conductive element 205 is small enough such that a laser source providing magnetization processes to the magnetoresistance elements 232A-232C is not inhibited by the placement or location of the thermal conductive element 205.

The top thermal conductive element 205 is coupled to the first portion 222A of the first conductive layer 222. As shown in FIG. 2, the top thermal conductive element 205 disposed over a first metal jumper interconnect 260A. The first conductive layer 222 may be substantially similar to the first conductive layer 122 of FIG. 1.

The first portion 222A of the first conductive layer 222 is disposed over and coupled to a first portion 224A of a second conductive layer 224 through vias 240A. The second conductive layer 224 may be substantially similar to the second conductive layer 124 of FIG. 1.

The first and second magnetoresistance elements 232A and 232B are disposed over and coupled to respective second and third portions (222B and 222C) of the first conductive layer 222 through respective vias, 240B and 240C. Likewise, second portion 222B is coupled to a second portion 224B of the second conductive layer 224 through vias 240F. The second portion 224B comprises the integrated circuit interconnection that connects the magnetoresistance elements to the underlying circuitry and base substrate of the circuit 200. A third portion 222C of the first conductive layer 222 comprises an interconnect that connects magnetoresistance element 232B and magnetoresistance element 232C.

The first metal filler 250A in the first conductive layer 222 is coupled to a third portion 224C of the second conductive layer 224 through vias 240D, and the second metal filler 250B in the first conductive layer 222 is coupled to a fourth portion 224D of the second conductive layer 224 through vias 240E.

When heat is applied to the first magnetoresistance element and the second magnetoresistance element, the heat is evacuated through the vias 240B and 240C, the second and third portions 222B and 222C of the first conductive layer 222, the vias 240F, the second portion 224B of the second conductive layer 224, the metal fillers 250A and 250B, the vias 240D and 240E, and the corresponding third and fourth portions 224C and 224D of the second conductive layer 224, as well as through one or more layers 226, 228, 229, to the substrate 210.

Additionally, heat may be diffused through the third portion 222C of the first conductive layer in which the third portion 222C, acting as the interconnect between magnetoresistance element 232B and 232C, transfers the heat through the third magnetoresistance element 232C (by way of vias 240G and metal jumper interconnect 260B and vias 240H).

In addition, the heat may also be diffused through first portion 224A of the second conductive layer 224, the vias 240A, the first portion 222A of the first conductive layer, and the top thermal conductive element 205.

Figure 3:
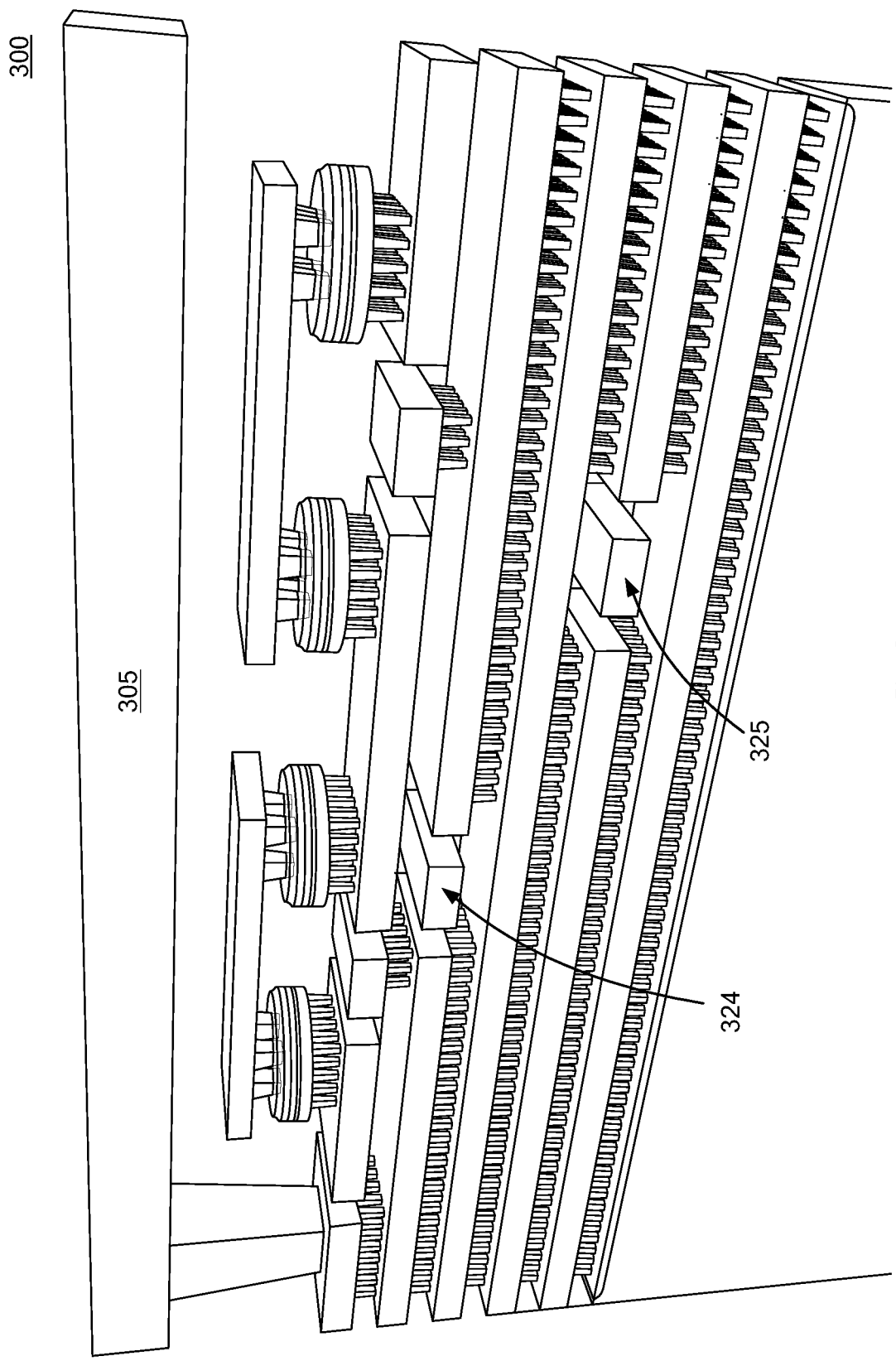
FIG. 3 is a perspective view of a multi-layer integrated circuit including a magnetoresistive array having enhanced thermal dissipation in accordance with another embodiment.

Turning now to FIG. 3, a perspective view of a multi-layer integrated circuit 300 with enhanced heat dissipation is shown. The integrated circuit 300 of FIG. 3 may have a layout that is similar to the embodiment shown in FIG. 1. The circuit 300 includes a top thermal conductive element 305, which element is described further in FIG. 2 (e.g., thermal conductive element 205), and also the placement of the integrated circuit connections (e.g., 324 and 325) within the layers of the circuit 300 differ. Heat diffusion among the components of the circuit 300 may be achieved in a similar manner as that described above in FIGS. 1 and 2.

Turning now to FIGS. 4A-4D, flow diagrams 400A-400D for manufacturing the multi-layer integrated circuit of any of FIGS. 1-3 will now be described in accordance with embodiments. The circuit comprises a base silicon substrate and a number of conductive layers that may be disposed on the circuit. In FIG. 4A, the process 400A builds the multi-layer integrated circuit having a first magnetoresistance element, a first metal filler, and a first integrated circuit interconnection configured to enhance heat dissipation resulting from magnetization of the magnetoresistance element. In block 402, the process 400A includes providing a first conductive layer for the multi-layer integrated circuit. In block 404, the process 400A disposes a first magnetoresistance element over a first portion of the first conductive layer and couples the first magnetoresistance element to the first portion of the first conductive layer through first vias.

In block 406, the process 400A includes disposing the first conductive layer over a second conductive layer in the multi-layer integrated circuit and coupling the first portion of the first conductive layer to a first portion of the second conductive layer through second vias. The first portion of the second conductive layer includes a first integrated circuit interconnection connecting the first magnetoresistance element to circuitry and the silicon base substrate of the multi-layer integrated circuit.

In block 408, the process 400A includes disposing a first metal filler proximate to the first portion of the first conductive layer and the first magnetoresistance element. In block 410, the process 400A includes coupling the first metal filler to a second portion of the second conductive layer through third vias.

In block 412, the process 400A includes magnetizing the first magnetoresistance element to produce a first magnetic orientation. In this configuration, heat resulting from a physical input applied to the first magnetoresistance element is evacuated away from the first magnetoresistance element (e.g., toward the silicon base substrate of the multi-layer integrated circuit through the first vias, the first portion of the first conductive layer, the second vias, the first integrated circuit interconnection of the first portion of the second conductive layer, the first metal filler, the third vias, and the second portion of the second conductive layer).

The process 400B of FIG. 4B, the process 400B adds a second magnetoresistance element and a metal jumper configured to further enhance heat dissipation resulting from magnetization of the magnetoresistance elements. In block 414, the process 400B includes disposing the second magnetoresistance element over a second portion of the first conductive layer and coupling the second magnetoresistance element to the second portion of the first conductive layer through fourth vias.

In block 416, the process 400B includes disposing a first metal jumper interconnect over the first magnetoresistance element and the second magnetoresistance element and coupling the first metal jumper interconnect to the first magnetoresistance element through fifth vias and to the second magnetoresistance element through sixth vias in block 418.

In block 420, the process 400B includes magnetizing the second magnetoresistance element simultaneously with the first magnetoresistance element.

In this configuration, heat resulting from the input applied to the first magnetoresistance element is further evacuated away from the first magnetoresistance element (e.g., toward the silicon base substrate of the multi-layer integrated circuit through the fifth vias, the first metal jumper interconnect, the sixth vias, the second magnetoresistance element, the fourth vias, and the second portion of the first conductive layer).

In FIG. 4C, the process 400C adds a third magnetoresistance element and a second metal filler to the multi-layer integrated circuit to further enhance heat dissipation resulting from magnetization of the magnetoresistance element.

In block 422, the process 400C includes disposing the third magnetoresistance element over the second portion of the first conductive layer and coupling the third magnetoresistance element to the second portion of the first conductive layer through seventh vias.

In block 424, the process 400C includes disposing the second metal filler proximate to the second portion of the first conductive layer and the third magnetoresistance element and coupling the second metal filler to the second portion of the second conductive layer through eighth vias in block 426. The second portion of the first conductive layer includes opposing first and second edges. The first metal filler is disposed adjacent to the first edge of the second portion of the first conductive layer, and the second metal filler is disposed adjacent to the second edge of the second portion of the first conductive layer.

In block 428, the process 400C includes magnetizing the third magnetoresistance element to produce a second magnetic orientation that is different from the first magnetic orientation (from block 412 of FIG. 4A).

In this configuration, heat resulting from a physical input applied to the third magnetoresistance element is evacuated away from the third magnetoresistance element (e.g., toward the silicon base substrate of the multi-layer integrated circuit through the seventh vias, the second portion of the first conductive layer, the second metal filler, the eighth vias, and the second portion of the second conductive layer).

In FIG. 4D, the process 400D adds a fourth magnetoresistance element, a second metal jumper, and a second integrated circuit interconnection, configured to further enhance heat dissipation through the multi-layer integrated circuit. In block 430, the process 400D includes disposing the fourth magnetoresistance element over a third portion of the first conductive layer and coupling the fourth magnetoresistance element to the third portion of the first conductive layer through ninth vias.

In block 432, the process 400D includes disposing the third portion of the first conductive layer over a third portion of the second conductive layer and coupling the third portion of the first conductive layer to the third portion of the second conductive layer through tenth vias. The third portion of the second conductive layer includes a second integrated circuit interconnection connecting the fourth magnetoresistance element to the circuitry and the silicon base substrate of the multi-layer integrated circuit.

In block 434, the process 400D includes disposing a second metal jumper interconnect over the third and fourth magnetoresistance elements and coupling the second metal jumper interconnect to the third magnetoresistance element through eleventh vias and to the fourth magnetoresistance element through twelfth vias. In embodiments, the second metal filler is disposed between the third magnetoresistance element and the fourth magnetoresistance element in the first conductive layer.

In this configuration, heat resulting from a physical input applied to the fourth magnetoresistance element is evacuated away from the fourth magnetoresistance element (e.g., toward the silicon base structure of the multi-layer integrated circuit through the ninth vias, the third portion of the first conductive layer, the tenth vias, the second integrated circuit interconnection of the third portion of the second conductive layer, the twelfth vias, the second metal jumper interconnect, the eleventh vias, the third magnetoresistance element, the seventh vias, the second portion of the first conductive layer, the second metal filler, the eighth vias, and the second portion of the second conductive layer).

As indicated above with respect to FIG. 2, the multi-layer integrated circuit may also include a top thermal conductive element (e.g., a top metal) that is coupled to the first conductive layer and which may also provide heat dissipation properties during magnetoresistance element magnetization processes.

Figure 5:
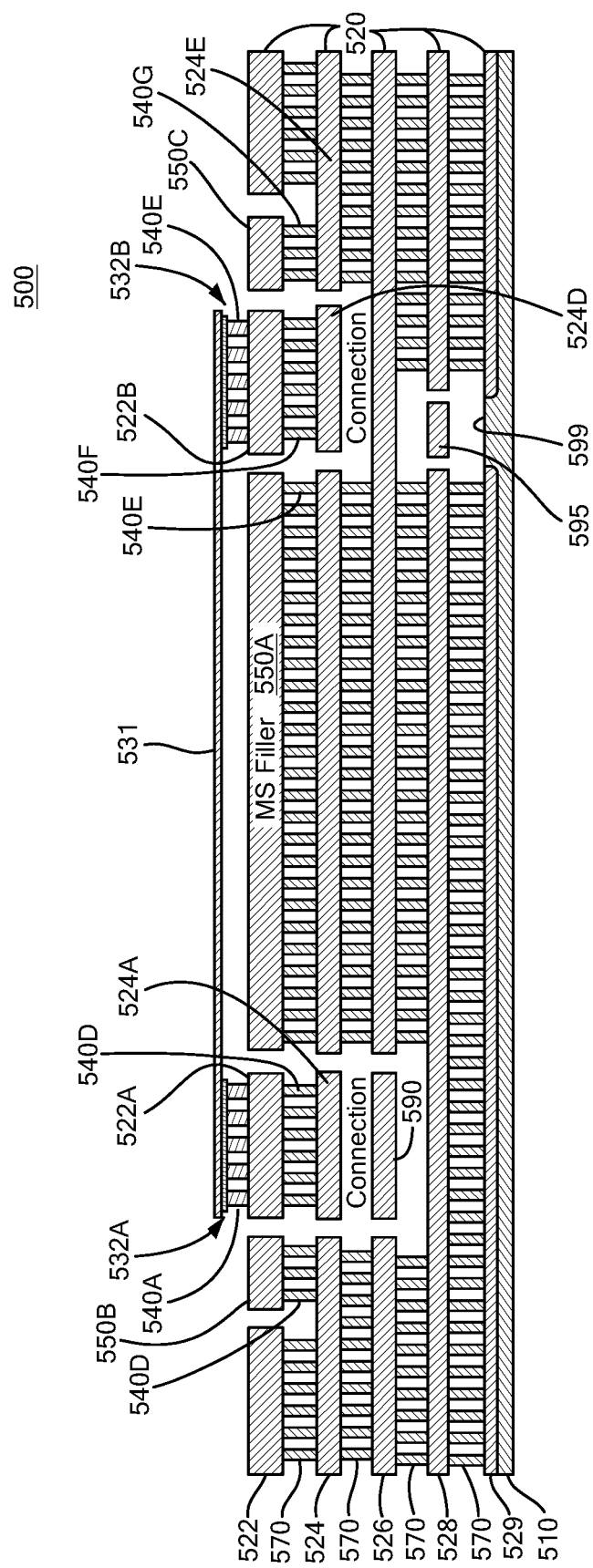
FIG. 5 is a cross-sectional view of a multi-layer integrated circuit including a magnetoresistive array having enhanced thermal dissipation in accordance with a further embodiment.

Turning now to FIG. 5, a cross-sectional view of a multi-layer integrated circuit 500 including a magnetoresistive array having enhanced thermal dissipation will now be described in accordance with another embodiment. In the embodiment shown in FIG. 5, the magnetoresistance element is a giant magnetoresistance element (GMR). Referring to FIG. 5, an embodiment of the integrated circuit 500 generally includes a base substrate 510, multiple conductive layers 522, 524, 526, 528, and 529 (collectively referred to herein as "520"), a magnetoresistive element 531, metal fillers 550A-500C (collectively referred to as "550"), and various interconnects and circuitry (not shown), as will be described further herein.

In embodiments, the base substrate 510 may be comprised of silicon. Layers of the integrated circuit are coupled by vias (collectively shown as 570) that include the interconnects that connect the magnetoresistance array elements to the underlying circuitry (not shown) of the integrated circuit 500 (e.g., where the circuitry resides in the base substrate 510). In embodiments, the lower metal layer 529 (e.g., polysilicon layer) is directly above the base substrate 510. The polysilicon layer 529 may be connected to the substrate 510 through inter-layer dielectrics (ILDs) that form an insulating layer between interconnects in the circuit.

In embodiments, the level of thermal dissipation achieved during a magnetization process of the magnetoresistance array is a function of at least the number of conductive layers 520 contained in the multi-layer integrated circuit, the number and physical placement of metal fillers (e.g., 550A-550C), the number and physical placement of interconnect layers 570, via density in the interconnect layers, as well as other factors, as will now be described.

As shown in the embodiment depicted in FIG. 5, the multi-layer integrated circuit 500 includes a first conductive layer 522 and a magnetoresistance element 531 disposed over and coupled to first and second portions 522A, B of the first conductive layer 522 through vias 540A, 540E. In the embodiment shown in FIG. 5, the magnetoresistance element 531 comprises a giant magnetoresistance (GMR) element.

The first conductive layer 522 is disposed over a second conductive layer 524 in the multi-layer integrated circuit 500, and the first portion 522A of the first conductive layer 522 is coupled to a first portion 524A of the second conductive layer 524 through second vias 540B. In an embodiment, the first portion 524A of the second conductive layer 524 includes a first integrated circuit interconnection that electronically connects the magnetoresistance element 531 to the circuitry below via the layers 522 and 526-529 and, in turn, to the silicon base substrate 510 of the multi-layer integrated circuit 500. The circuitry may contain various electronic components, such as processors, logic, memory, switches, encoders/decoders, amplifiers, etc.).

In embodiments, a first metal filler 550A of the first conductive layer 522 is disposed proximate to the first portion 522A of the first conductive layer 522 and the magnetoresistance element 531. The first metal filler 550A may comprise any type of suitable thermally conductive material (e.g., a metal or composition of different metals). In an embodiment, the metal filler may be disposed on the second conductive layer in a location that is proximate to the magnetoresistance element and in any available space on the second conductive layer that is not already taken by other components of the circuit 500. Close proximity of the metal filler to the magnetoresistance element enables additional heat sink properties.

As shown in FIG. 5, the first metal filler 550A is positioned over and coupled to a second portion 524B of the second conductive layer 524 through third vias 540C.

A second metal filler 550B is disposed proximate to the first conductive portion 522A in the first conductive layer 522. As shown in FIG. 5, the first metal filler 550A is disposed proximate to one end of the first conductive portion 522A and the second metal filler 550B is shown proximate to an opposing end of the conductive portion 522A on the first conductive layer 522. The second metal filler 550B is coupled to a third conductive portion 524C of the second conductive layer 524 through fourth vias 540D.

As indicated above, magnetoresistance elements are magnetized in which a physical input is applied to the elements in order to magnetically orient the elements in various directions. In an embodiment, the physical input may be one of electrical current or laser pulses.

Thus, a magnetoresistance element 531 is magnetized to produce a first magnetic orientation. Elements 532A, B can smooth connections between vias 540A, 550E and the GMR element 531. During magnetization, heat resulting from a physical input applied to the magnetoresistance element 531 is evacuated away from the first magnetoresistance element through the first vias 540A, the first portion 522A of the first conductive layer 522, the second vias 540B, the first integrated circuit interconnection of the first portion 524A of the second conductive layer 524, the first metal filler 550A, the third vias 540C, the second portion 524B of the second conductive layer 524, as well as the alternating conductive layers 520 and via-containing interconnection layers 570 down to the substrate 510. In addition, heat resulting from the physical input applied to the magnetoresistance element 531 is further evacuated away through the second metal filler 550B, fourth vias 540D, the third portion 524C of the second conductive layer 524, as well as the alternating conductive layers 520 and via-containing interconnection layers 570 down to the substrate 510. In addition, heat applied to the magnetoresistance element 531 may dissipate, as will be described further herein.

The second portion 522B is disposed over and coupled to a second integrated circuit interconnection of the fourth portion 524D of the second conductive layer 524. The second integrated circuit interconnection electronically connects the magnetoresistance element 531 to the circuitry below the layers 522 and 526-529 and, in turn, to the silicon base substrate 510. The second portion 522B of the first conductive layer is coupled to the fourth portion 524D of the second conductive layer through sixth vias 540F.

The GMR 531 comprises metallic material with no insulating barrier that would require transversal, unlike the TMR embodiments of FIGS. 1-3; thus, no contacts/vias above the GMR 531 are needed (current applied with respect to the GMR array flows through the plane).

In embodiments, a third metal filler 550C is disposed proximate to the second portion 522B of the first conductive layer 522 and the element 532B. The second metal filler comprises a thermal conductive element. The third metal filler 550C is disposed over and coupled to a fifth portion 524E of the second conductive layer 524 through sixth vias 540F.

Heat resulting from a physical input applied to the magnetoresistance element 531 is evacuated away in varying directions (e.g., toward the silicon base substrate 510 of the multi-layer integrated circuit 500 through the fifth vias 540E, the second portion 522B of the first conductive layer 522, the sixth vias 540F, the integrated circuit interconnection of the fourth portion of the second conductive layer 524, the third metal filler 550C, the seventh vias 140G, the fifth portion 524B of the second conductive layer 524 down through the lower alternating conductive layers 520 and via-containing interconnection layers 570).

The vias 570 (including vias 540A-540G) may be formed in inter-metal dielectric (IMD) layers (e.g., a material placed between metal layers to isolate them). Non-limiting examples of the material include silicon oxide or silicon nitride.

As shown in FIG. 5, two non-connected elements 590 and 595 are provided to show that adding this heat-dissipation structure is compatible with other metal lines below the magnetoresistance elements. These metal lines are configured to route the electronic circuits on the die and thus may be widely used. Avoiding this when the heat-dissipation structures are present will be very limiting for the electronic design. Thus, a space, or hole, in the structures may be provided to leave the necessary space for these lines to pass. However, they are not electrically connected to avoid a short circuit (e.g., as non-connected element 599 is lined up with line 595.

Figure 6:
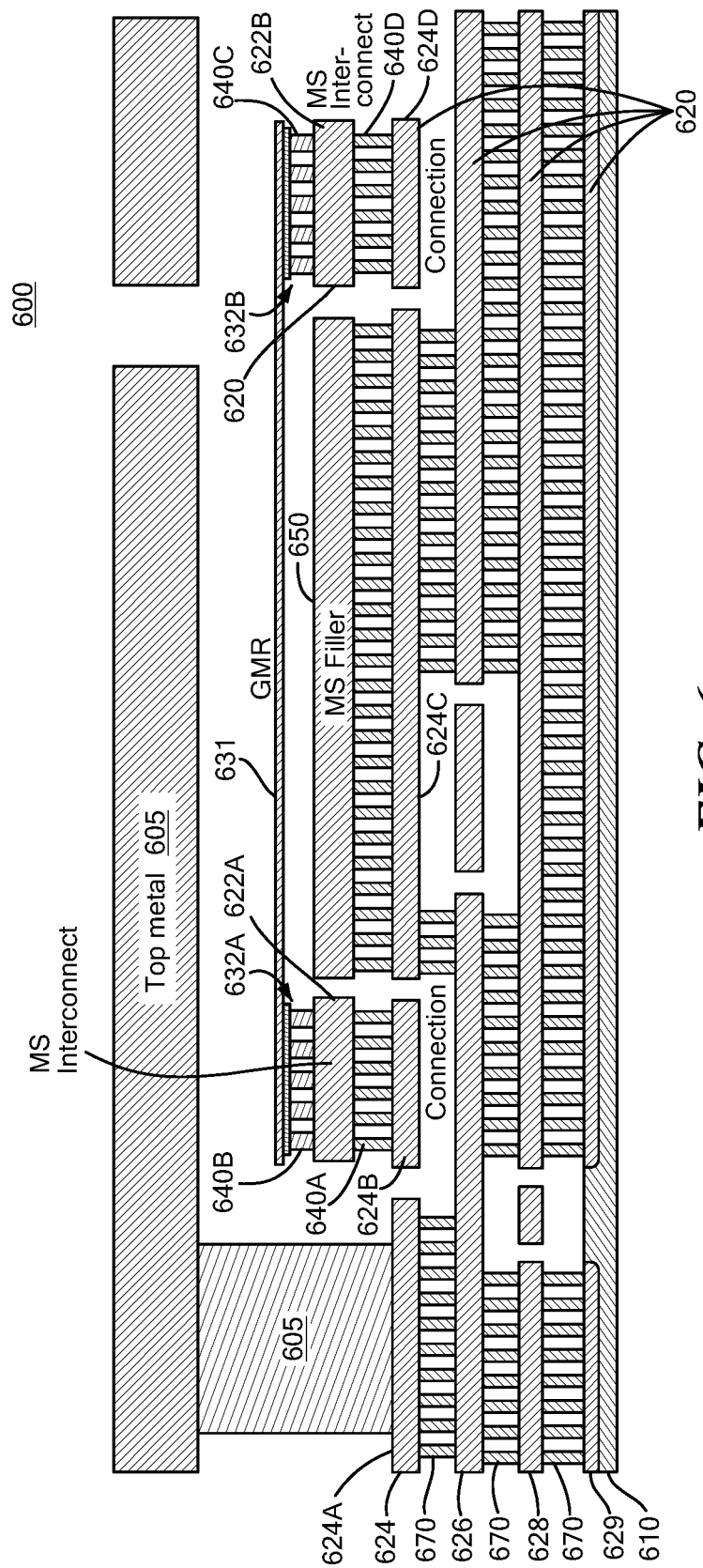
FIG. 6 is a cross-sectional view of a multi-layer integrated circuit including a magnetoresistive array having enhanced thermal dissipation in accordance with yet another embodiment.

Turning now to FIG. 6, a portion of a multi-layer integrated circuit 600 with enhanced thermal dissipation according to another embodiment will now be described. The circuit 600 may contain similar elements to those described above with respect to the circuit 500 of FIG. 5 and will not be further discussed.

The circuit 600 includes a base substrate 610, multiple conductive layers 620 (layers 622, 624, 626, 628, and 629), a magnetoresistive element 631 and smoothing elements 632A-632B, metal filler 650, and various interconnects (e.g., integrated circuit interconnection 224B) and circuitry (not shown). The magnetoresistance element 631 may comprise a GMR element. In embodiments, the level of thermal dissipation achieved is a function of at least the number of conductive layers contained in the multi-layer integrated circuit, the number and physical placement of metal fillers, and the number and physical placement of the interconnects.

In addition, the circuit 600 includes a top thermal conductive element 605 extending over and across the circuit 600. The thermal conductive element 605 may comprise any suitable conductive material, such as a metal. In an embodiment, the element 605 is connected all the way down to the substrate 610.

It is understood that the width, or dimensions, of the thermal conductive element 605 is small enough such that a laser source providing magnetization processes to the magnetoresistance element 631 is not inhibited by the placement or location of the thermal conductive element 605.

The top thermal conductive element 605 is coupled to a first portion 624A of the second conductive layer 624. A first portion 622A of the first conductive layer 622 is disposed over and coupled to a second portion 624B of the second conductive layer 624 through first vias 640A.

The magnetoresistance element 631 is disposed over and coupled to respective first and second portions (622A and 622B) of the first conductive layer 622 through respective vias, 640B and 640C. The second portion 624B comprises the integrated circuit interconnection that connects the magnetoresistance elements to the underlying circuitry and base substrate of the circuit 600. The second portion 622B is coupled to a fourth portion 624D of the second conductive layer through fourth vias 640D. The first and second portions 622A/622B of the first conductive layer 622 comprises an interconnect.

The metal filler 650 in the first conductive layer 622 is coupled to a third portion 624C of the second conductive layer 624 through fifth vias 640E.

When heat is applied to the first magnetoresistance element and the second magnetoresistance element, the heat is evacuated through the vias 640B and 640C, the first and second portions 622A and 622B of the first conductive layer 622, the vias 640A, 640D, the second portions 624B and 624D of the second conductive layer 624, the metal filler 650, the vias 640E, the third portion 624C of the second conductive layer 624, down through the lower alternating conductive layers 620 and via-containing interconnection layers 670).

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A multi-layer integrated circuit, comprising:
a first conductive layer;
a first magnetoresistance element disposed over and coupled to a first portion of the first conductive layer through first vias, the first magnetoresistance element magnetized to produce a first magnetic orientation, wherein the first conductive layer is disposed over a second conductive layer in the multi-layer integrated circuit, and the first portion of the first conductive layer is coupled to a first portion of the second conductive layer through second vias;
a first metal filler disposed proximate to the first portion of the first conductive layer and the first magnetoresistance element, the first metal filler positioned over and coupled to a second portion of the second conductive layer through third vias;
a first thermal dissipation path resulting from a physical input applied to the first magnetoresistance element, the first thermal dissipation path extending through the first vias, the first portion of the first conductive layer, the second vias, a first integrated circuit interconnection, the first metal filler, the third vias, and the second portion of the second conductive layer;
a second magnetoresistance element disposed over and coupled to a second portion of the first conductive layer through fourth vias, the second magnetoresistance element magnetized to produce the first magnetic orientation; and
a first metal jumper interconnect disposed over the first magnetoresistance element and the second magnetoresistance element, the first metal jumper interconnect coupled to the first magnetoresistance element through fifth vias and to the second magnetoresistance element through sixth vias;
wherein the first thermal dissipation path further extends through the fifth vias, the first metal jumper interconnect, the sixth vias, the second magnetoresistance element, the fourth vias, and the second portion of the first conductive layer.

2. The multi-layer integrated circuit of claim 1, wherein the first integrated circuit interconnection connects the first magnetoresistance element to circuitry and a silicon base substrate of the multi-layer integrated circuit.

3. The multi-layer integrated circuit of claim 1, further comprising:
a third magnetoresistance element disposed over and coupled to the second portion of the first conductive layer through seventh vias, the third magnetoresistance element magnetized to produce a second magnetic orientation that is different from the first magnetic orientation;
a second metal filler disposed proximate to the second portion of the first conductive layer and the third magnetoresistance element, the second metal filler disposed over and coupled to the second portion of the second conductive layer through eighth vias;
wherein the second portion of the first conductive layer includes opposing first and second edges wherein the first metal filler is disposed adjacent to the first edge of the second portion of the first conductive layer, and the second metal filler is disposed adjacent to the second edge of the second portion of the first conductive layer; and
a second thermal dissipation path resulting from a physical input applied to the third magnetoresistance element, the second thermal dissipation path extending through the seventh vias, the second portion of the first conductive layer, the second metal filler, the eighth vias, and the second portion of the second conductive layer.

4. The multi-layer integrated circuit of claim 3, further comprising:
a fourth magnetoresistance element disposed over and coupled to a third portion of the first conductive layer through ninth vias, the third portion of the first conductive layer disposed over and coupled to a third portion of the second conductive layer through tenth vias;
a second metal jumper interconnect disposed over the third and fourth magnetoresistance elements, the second metal jumper interconnect coupled to the third magnetoresistance element through eleventh vias and to the fourth magnetoresistance element through twelfth vias; and the second metal filler disposed between the third magnetoresistance element and the fourth magnetoresistance element in the first conductive layer; and a third thermal dissipation path resulting from a physical input applied to the fourth magnetoresistance element, the third thermal dissipation path extending through the ninth vias, the third portion of the first conductive layer, the tenth vias, a second integrated circuit interconnection, the twelfth vias, the second metal jumper interconnect, the eleventh vias, the third magnetoresistance element, the seventh vias, the second portion of the first conductive layer, the second metal filler, the eighth vias, and the second portion of the second conductive layer.

5. The multi-layer integrated circuit of claim 4, wherein the second integrated circuit interconnection connects the fourth magnetoresistance element to the circuitry and a silicon base substrate of the multi-layer integrated circuit.

6. The multi-layer integrated circuit of claim 3, wherein the second portion of the first conductive layer includes an interconnect structure interconnecting the second magnetoresistance element to the third magnetoresistance element.

7. The multi-layer integrated circuit of claim 1, further comprising:

a top thermal conductive element coupled to a fourth portion of the first conductive layer, the thermal conductive element disposed above the first metal jumper interconnect;

wherein the fourth portion of the first conductive layer is disposed over and coupled to a fourth portion of the second conductive layer through thirteenth vias;

wherein the first thermal dissipation path further extends through the fourth portion of the first conductive layer, the thirteenth vias, and the fourth portion of the second conductive layer.

8. The multi-layer integrated circuit of claim 7, wherein the first thermal dissipation path further extends through the top thermal conductive element via the fourth portion of the first conductive layer.

9. The multi-layer integrated circuit of claim 1, wherein the first vias comprise inter-metal dielectrics.

10. The multi-layer integrated circuit of claim 1, wherein the physical input is one of electrical current and laser pulses.

11. The multi-layer integrated circuit of claim 1, wherein the first metal filler comprises a thermal conductive element.

12. A multi-layer integrated circuit, comprising:

a first conductive layer;

a first magnetoresistance element disposed over and coupled to a first portion of the first conductive layer through first vias, the first magnetoresistance element magnetized to produce a first magnetic orientation, wherein the first conductive layer is disposed over a second conductive layer in the multi-layer integrated circuit, and the first portion of the first conductive layer is coupled to a first portion of the second conductive layer through second vias;

a first metal filler disposed proximate to the first portion of the first conductive layer and the first magnetoresistance element, the first metal filler positioned over and coupled to a second portion of the second conductive layer through third vias;

a first thermal dissipation path resulting from a physical input applied to the first magnetoresistance element, the first thermal dissipation path extending through the first vias, the first portion of the first conductive layer, the second vias, a first integrated circuit interconnection, the first metal filler, the third vias, and the second portion of the second conductive layer;

wherein the first metal filler comprises one of aluminum and tungsten.

13. The multi-layer integrated circuit of claim 1, wherein the first magnetoresistance element is a tunneling magnetoresistance (TMR) element.

14. A multi-layer integrated circuit, comprising:

a first conductive layer;

a first magnetoresistance element disposed over and coupled to a first portion of the first conductive layer through first vias, the first magnetoresistance element magnetized to produce a first magnetic orientation, wherein the first conductive layer is disposed over a second conductive layer in the multi-layer integrated circuit, and the first portion of the first conductive layer is coupled to a first portion of the second conductive layer through second vias;

a first metal filler disposed proximate to the first portion of the first conductive layer and the first magnetoresistance element, the first metal filler positioned over and coupled to a second portion of the second conductive layer through third vias; and a first thermal dissipation path resulting from a physical input applied to the first magnetoresistance element, the first thermal dissipation path extending through the first vias, the first portion of the first conductive layer, the second vias, a first integrated circuit interconnection, the first metal filler, the third vias, and the second portion of the second conductive layer;

wherein the first magnetoresistance element is a giant magnetoresistance (GMR) element.

15. The multi-layer integrated circuit of claim 1, wherein the first thermal dissipation path further extends through circuit layers to a base substrate.

16. A method of manufacturing a multi-layer integrated circuit, the method comprising:

providing a first conductive layer;

disposing a first magnetoresistance element over a first portion of the first conductive layer and coupling the first magnetoresistance element to the first portion of the first conductive layer through first vias;

disposing the first conductive layer over a second conductive layer in the multi-layer integrated circuit, and coupling the first portion of the first conductive layer to a first portion of the second conductive layer through second vias;

disposing a first metal filler proximate to the first portion of the first conductive layer and the first magnetoresistance element in the first conductive layer;

coupling the first metal filler to a second portion of the second conductive layer through third vias; and magnetizing the first magnetoresistance element to produce a first magnetic orientation, wherein heat resulting from a physical input applied to the first magnetoresistance element is evacuated away from the first magnetoresistance element through the first vias, the first portion of the first conductive layer, the second vias, a first integrated circuit interconnection, the first metal filler, the third vias, and the second portion of the second conductive layer.

17. The method of claim 16, further comprising:

disposing a second magnetoresistance element over a second portion of the first conductive layer, and coupling the second magnetoresistance element to the second portion of the first conductive layer through fourth vias; and disposing a first metal jumper interconnect over the first magnetoresistance element and the second magnetoresistance element, and coupling the first metal jumper interconnect to the first magnetoresistance element through fifth vias and to the second magnetoresistance element through sixth vias;

magnetizing the second magnetoresistance element simultaneously with the first magnetoresistance element;

wherein heat resulting from the physical input applied to the first magnetoresistance element is further evacuated away from the first magnetoresistance element through the fifth vias, the first metal jumper interconnect, the sixth vias, the second magnetoresistance element, the fourth vias, and the second portion of the first conductive layer.

18. The method of claim 16, wherein the first integrated circuit interconnection connects the first magnetoresistance element to circuitry and a silicon base substrate of the multi-layer integrated circuit.

19. The method of claim 17, further comprising:

disposing a third magnetoresistance element over the second portion of the first conductive layer, and coupling the third magnetoresistance element to the second portion of the first conductive layer through seventh vias;

disposing a second metal filler proximate to the second portion of the first conductive layer and the third magnetoresistance element, and coupling the second metal filler to the second portion of the second conductive layer through eighth vias;

wherein the second portion of the first conductive layer includes opposing first and second edges wherein the first metal filler is disposed adjacent to the first edge of the second portion of the first conductive layer, and the second metal filler is disposed adjacent to the second edge of the second portion of the first conductive layer; and magnetizing the third magnetoresistance element to produce a second magnetic orientation that is different from the first magnetic orientation, wherein heat resulting from a physical input applied to the third magnetoresistance element is evacuated away from the third magnetoresistance element through the seventh vias, the second portion of the first conductive layer, the second metal filler, the eighth vias, and the second portion of the second conductive layer.

20. The method of claim 19, further comprising:

disposing a fourth magnetoresistance element over a third portion of the first conductive layer, and coupling the fourth magnetoresistance element to the third portion of the first conductive layer through ninth vias;

disposing the third portion of the first conductive layer over a third portion of the second conductive layer, and coupling the third portion of the first conductive layer to the third portion of the second conductive layer through tenth vias; and disposing a second metal jumper interconnect over the third and fourth magnetoresistance elements, and coupling the second metal jumper interconnect to the third magnetoresistance element through eleventh vias and to the fourth magnetoresistance element through twelfth vias;

wherein the second metal filler disposed between the third magnetoresistance element and the fourth magnetoresistance element in the first conductive layer;

wherein heat resulting from a physical input applied to the fourth magnetoresistance element is evacuated away from the fourth magnetoresistance element through the ninth vias, the third portion of the first conductive layer, the tenth vias, the second integrated circuit interconnection, the twelfth vias, the second metal jumper interconnect, the eleventh vias, the third magnetoresistance element, the seventh vias, the second portion of the first conductive layer, the second metal filler, the eighth vias, and the second portion of the second conductive layer.

21. The method of claim 20, wherein the second integrated circuit interconnection connects the fourth magnetoresistance element to the circuitry and a silicon base substrate of the multi-layer integrated circuit.

22. The method of claim 19, wherein the second portion of the first conductive layer includes an interconnect structure, the method further comprising connecting the second magnetoresistance element to the third magnetoresistance element via the interconnect structure.

23. The method of claim 17, further comprising:

disposing a top thermal conductive element over the first metal jumper interconnect, and coupling the top thermal conductive element to a fourth portion of the first conductive layer; and disposing the fourth portion of the first conductive layer over a fourth portion of the second conductive layer, and coupling the fourth portion of the first conductive layer to the fourth portion of the second conductive layer through thirteenth vias;

wherein heat applied to the first magnetoresistance element and the second magnetoresistance element is further evacuated through the fourth portion of the first conductive layer, the thirteenth vias, and the fourth portion of the second conductive layer.

24. The method of claim 23, wherein the heat applied to the first magnetoresistance element and the second magnetoresistance element is further evacuated through the top thermal conductive element via the fourth portion of the first conductive layer.

25. The method of claim 16, wherein an amount of heat evacuated from the first magnetoresistance element is a function of a number of conductive layers contained in the multi-layer integrated circuit, the number of conductive layers including at least the first conductive layer and the second conductive layer.

26. The method of claim 16, wherein an amount of heat evacuated from the first magnetoresistance element is a function of:

a number and physical placement of metal fillers, the metal fillers including the first metal filler; and a number and physical placement of integrated circuit interconnections, the integrated circuit interconnections including the integrated circuit connection.

27. The method of claim 16, wherein the first vias comprise inter-metal dielectrics.

28. The method of claim 16, wherein the physical input is one of electrical current and laser pulses.

29. The method of claim 16, wherein the first metal filler comprises a thermal conductive element.

30. The method of claim 16, wherein the first metal filler comprises one of aluminum and tungsten.

31. The method of claim 16, wherein the first magnetoresistance element is a tunneling magnetoresistance (TMR) element.

32. The method of claim 16, wherein the first magnetoresistance element is a giant magnetoresistance (GMR) element.

33. The method of claim 16, wherein heat resulting from the physical input applied to the first magnetoresistance element is further evacuated away through circuit layers to a base substrate.

34. The multi-layer integrated circuit of claim 12, wherein the first integrated circuit interconnection connects the first magnetoresistance element to circuitry and a silicon base substrate of the multi-layer integrated circuit.

35. The multi-layer integrated circuit of claim 12, wherein the first vias comprise inter-metal dielectrics.

36. The multi-layer integrated circuit of claim 12, wherein the physical input is one of electrical current and laser pulses.

37. The multi-layer integrated circuit of claim 12, wherein the first metal filler comprises a thermal conductive element.

38. The multi-layer integrated circuit of claim 12, wherein the first magnetoresistance element is a tunneling magnetoresistance (TMR) element.

39. The multi-layer integrated circuit of claim 12, wherein the first magnetoresistance element is a giant magnetoresistance (GMR) element.

40. The multi-layer integrated circuit of claim 12, wherein the first thermal dissipation path further extends through circuit layers to a base substrate.

41. The multi-layer integrated circuit of claim 14, wherein the first integrated circuit interconnection connects the first magnetoresistance element to circuitry and a silicon base substrate of the multi-layer integrated circuit.

42. The multi-layer integrated circuit of claim 14, wherein the first vias comprise inter-metal dielectrics.

43. The multi-layer integrated circuit of claim 14, wherein the physical input is one of electrical current and laser pulses.

44. The multi-layer integrated circuit of claim 14, wherein the first metal filler comprises a thermal conductive element.

45. The multi-layer integrated circuit of claim 14, wherein the first thermal dissipation path further extends through circuit layers to a base substrate.

* * * * *